US006474758B1

(12) United States Patent
Hedrick et al.

(10) Patent No.: US 6,474,758 B1
(45) Date of Patent: Nov. 5, 2002

(54) DUAL ACTION DOOR HINGING

(75) Inventors: Joseph R. Hedrick; Jean Pierre Legras; Noel D. Brodzinski, all of Reno, NV (US)

(73) Assignee: International Game Technology, Reno, NV (US)

( * ) Notice: Subject to any disclaimer, the term of this patent is extended or adjusted under 35 U.S.C. 154(b) by 0 days.

(21) Appl. No.: 09/679,751

(22) Filed: Oct. 5, 2000

(51) Int. Cl.[7] .................................................. H03K 5/00
(52) U.S. Cl. ..................................... 312/223.1; 312/322
(58) Field of Search ........................... 312/223.1, 223.2, 312/223.3, 322, 7.2, 292, 334.13, 330.1, 327, 328, 333, 350, 293.2; 49/254, 257, 258, 394, 503; 292/201, 163, 175, 169, 140, 146; 273/434, 85 R, DIG. 28, 148 B; 463/46, 20

(56) References Cited

U.S. PATENT DOCUMENTS 886,192 A * 4/1908 De Canio .......... 312/334.13 X
4,397,509 A * 8/1983 Miller et al.
5,105,978 A * 4/1992 Trouteaud et al.
5,120,060 A * 6/1992 Parker et al.
5,232,191 A 8/1993 Infanti
5,575,515 A * 11/1996 Iwamoto et al.
5,593,048 A * 1/1997 Johnson .................. 312/322 X
5,593,192 A * 1/1997 Stuchinsky ............. 292/163 X
5,676,231 A 10/1997 Legras et al.
5,762,617 A 6/1998 Infanti
5,826,882 A 10/1998 Ward
5,951,397 A 9/1999 Dickinson
6,005,641 A * 12/1999 Ui ........................... 312/7.2 X

* cited by examiner

*Primary Examiner*—Janet M. Wilkens
(74) *Attorney, Agent, or Firm*—Marshall, Gerstein & Borun

(57) ABSTRACT

A dual action access door for a gaming machine that is formed from the lower front housing portion. In order to minimize the space required between adjacent gaming machines, while providing full access to the interior of the machine, the front housing portion is carried by a door chassis which enables the front housing portion to move in a drawer-like manner from a fully closed position to an extended position. In order to provide full access to the interior of the gaming machine, the front housing portion is pivotally connected on one end to the door chassis to enable the door to pivot about an axis generally parallel to a vertical datum in at least a partially extended position of the door chassis. One or more latching mechanisms may be provided to latch the front housing portion to latch the front housing portion in a closed position. The dual action mounting of the front housing portion allows full access to the interior of the gaming machine while at the same time enabling gaming machines to be placed closer together, thus optimizing the number of gaming machines that can be placed in a given area of a casino or other gambling facility floor.

25 Claims, 13 Drawing Sheets

DUAL ACTION DOOR HINGING

CROSS-REFERENCE TO RELATED APPLICATIONS

This application is related to the following commonly-owned co-pending utility patent applications: "Next Generation Video/Reel Product", by Jean Pierre Legras, and Joseph R. Hedrick, Ser. No. 09/680,108, "Integrated Footrests", by Joseph R. Hedrick and Jean Pierre Legras, Ser. No. 09/679,754, "Remote Bet Button", by Joseph R. Hedrick, Jean Pierre Legras and Noel D. Brodzinski, Ser. No. 09/679,753, and a design patent application entitled "Gaming Machine", by Joseph R. Hedrick and Jean Pierre Legras, Ser. No. 29/130,606 all filed on Oct. 5, 2000 now U.S. Pat. No. D451150.

BACKGROUND OF THE INVENTION

1. Field of the Invention

The present invention relates to gaming machines and more particularly to a dual action door arrangement which provides improved access to the interior of gaming machines for in-situ maintenance while enabling gaming machines to be placed closer together to optimize the number of gaming machines that can be placed in a given area on a casino or other gambling facility floor.

2. Description of the Prior Art

Various types of gaming machines are known. Since such gaming machines require service from time to time, access is known to be provided in the front of the machine to enable in-situ maintenance and repair of the gaming machine. Such access doors limit the number of gaming machines that can be placed in a given area in a casino or other gambling facility floor. In particular, in some known gaming machines the lower front portion of the gaming machine housing is hinged on one end and acts as the access door to the interior of the gaming machine. Since the lower front housing portion of such gaming machines normally carry the gaming controls for playing the game, such access doors require a substantial amount of clearance in order to provide full access to the interior of the gaming machine. As such, gaming machines with such configurations must be spaced apart to provide sufficient access thus decreasing the number of gaming machines that can be placed on a casino floor. Thus, there is a need to provide access to the interior of a gaming machine which optimizes the number of gaming machines that can be placed on a given area on a casino floor while providing full access to the interior of the machine.

SUMMARY OF THE INVENTION

A gaming machine may include a housing that may have first and second side housing portions, a top housing portion, a bottom housing portion and a front housing portion. The gaming machine may also include a plurality of telescoping members associated with the housing. The front housing portion may be coupled to the plurality of telescoping members and adapted to slide between a closed position and an open position. The gaming machine may also include a video display associated with the housing and adapted to display video gambling game images, a value accepting device associated with the housing and adapted to receive value to be wagered on an outcome of a video gambling game and a control panel associated with the housing and adapted to allow a user to control play of the video gambling game. be placed closer together, thus optimizing the number of gaming machines that can be placed in a given area of a casino or other gambling facility floor.

BRIEF DESCRIPTION OF THE DRAWING

These and other advantages of the present invention will be apparent from the following description and attached drawing wherein.

DETAILED DESCRIPTION

Figure 1:
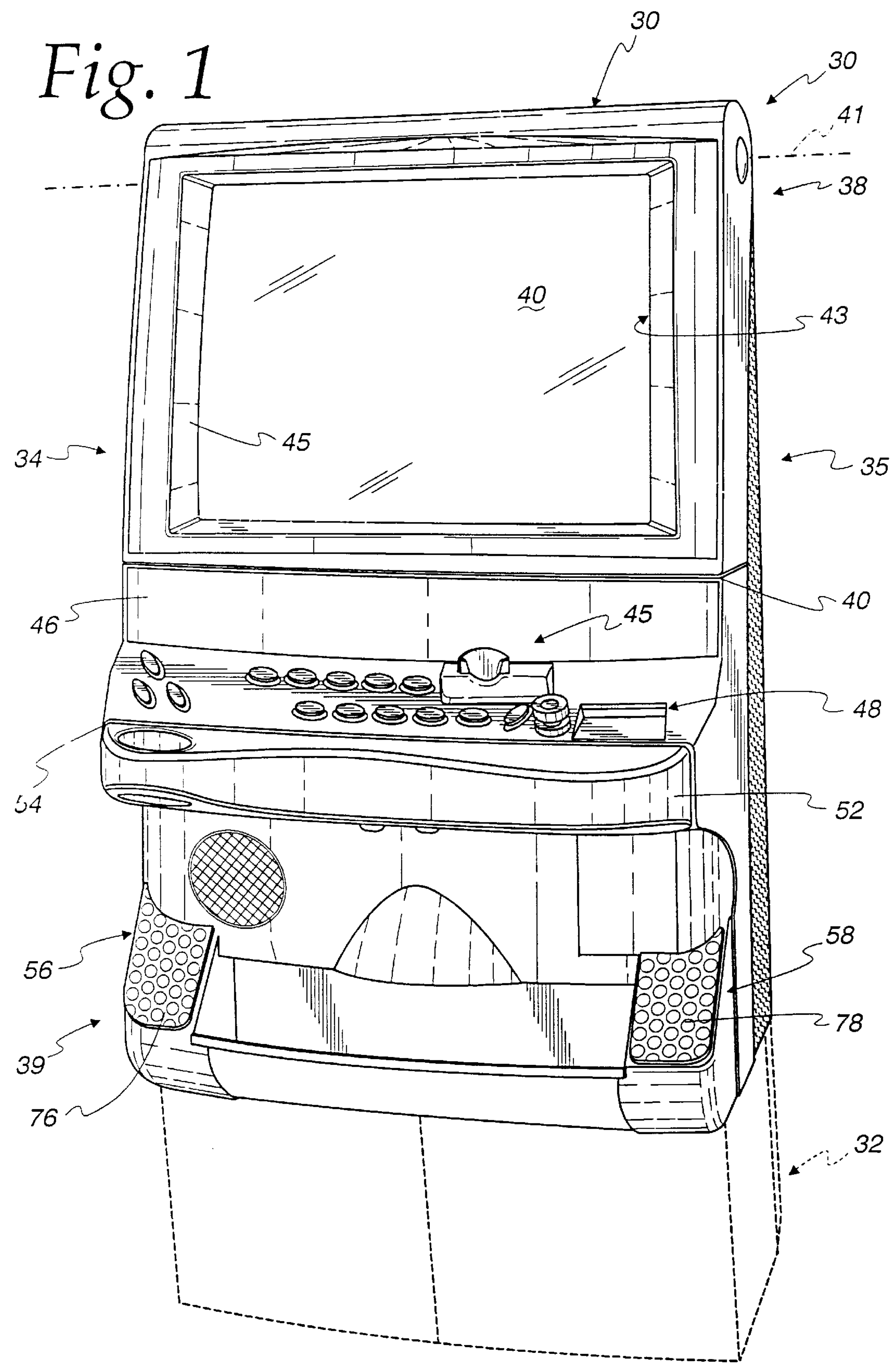
FIG. 1 front perspective view of an exemplary embodiment of a gaming machine housing, in accordance with the present invention, shown sitting or a pedestal, illustrated in phantom.

The present invention relates to an improved gaming machine housing. FIGS. 1–8 illustrate an improved configuration for a gaming machine which provides improved player comfort and also a smaller footprint to optimize the number of gaming machines that can be placed in a given area on a casino floor. FIG. 9 illustrates a cluster of the gaming machines illustrated in FIGS. 1–8 organized in a circular configuration. FIGS. 10–20 relate to an improved door support for an access door for the machine which enables gaming machines to placed closer together. FIGS. 21–24 relate to an extendable bet button for improving player comfort. FIGS. 1–3 and 6 illustrate a footrest that is integrated into the front housing portion which together with a remote bet button improves player comfort as generally shown in FIG.

IMPROVED GAMING MACHINE CONFIGURATION

As best shown in FIGS. 1–8, an improved gaming machine housing configuration, in accordance with the present invention, provides improved player comfort while at the same time provides a relatively small footprint to optimize the number of gaming machines that can occupy a given area on a casino floor. As shown, the gaming machine housing, in accordance with the present invention, generally identified with the reference numeral 30, may be provided with an integral or separate pedestal 32. The height of the pedestal 32 is selected so that the height of the player controls and video display surface are compatible with a standard gaming machine stool 29 (FIGS. 21, 22), for example, as manufactured by Gary Platt Manufacturing Inc. or as disclosed in U.S. Pat. No. 5,232,191, hereby incorporated by reference.

Figure 2:
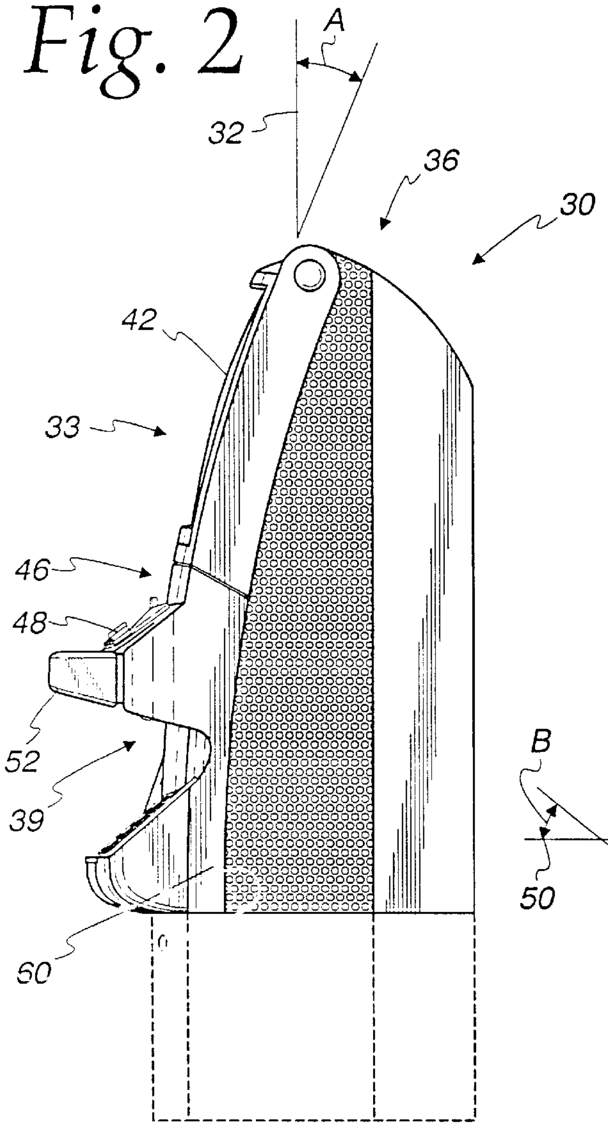
FIG. 2 is a perspective view of the left side of the gaming machine housing illustrated in FIG. 1.
Figure 3:
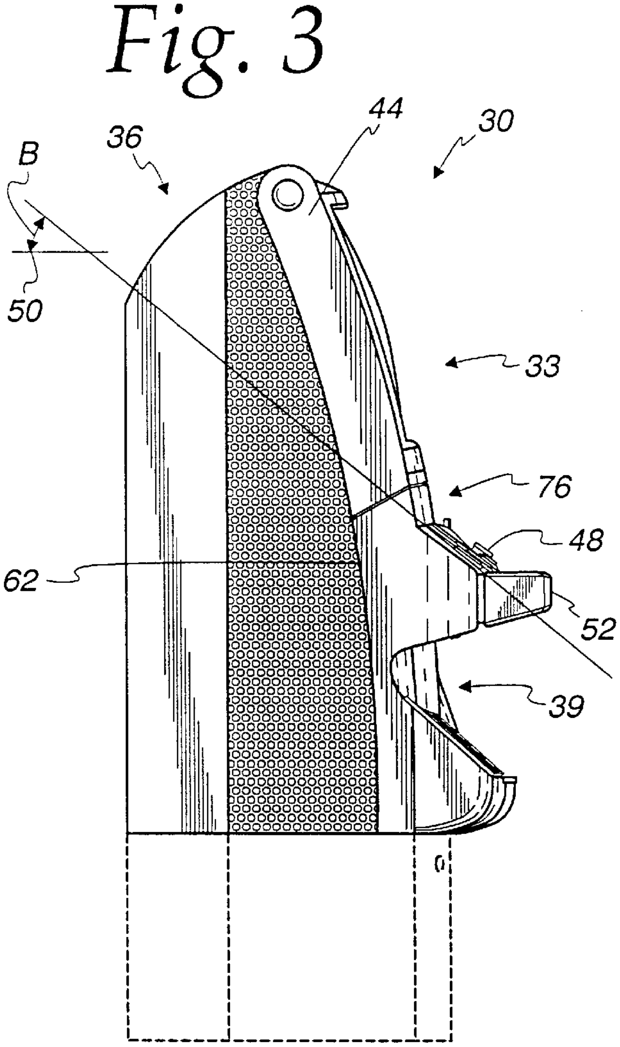
FIG. 3 is a perspective view of the right side of the gaming machine housing illustrated in FIG. 1.
Figure 4:
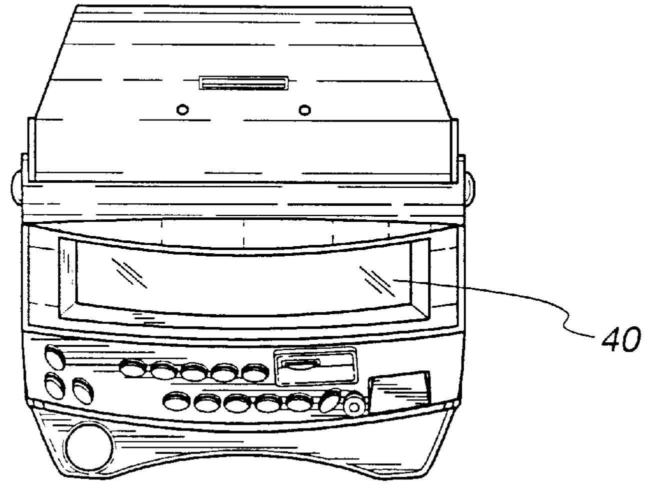
FIG. 4 is a perspective view of the gaming machine housing illustrated in FIG. 1.

As best shown in FIGS. 1–3, the gaming machine housing 30 is of irregular shape and is configured to enable the video display 40 to be carried in a plane at an angle A (FIG. 2), relative to a vertical datum 32. The angle A is selected to improve player comfort in a manner similar to that of a conventional slant top machine while at the same time providing the type of visibility of the video display 40 as conventional upright gaming machines. The angle A may be varied from about 5° to 85°, preferable between 20° and 40°, relative to the vertical datum 32 (FIG. 2). In accordance with another important aspect of the invention, the sides of the housing are formed at least in part to converge toward one another. Such a configuration reduces the footprint of the machine in order to optimize the number of gaming machines that can be placed in a given area on a casino or other gambling facility floor.

Figure 10:
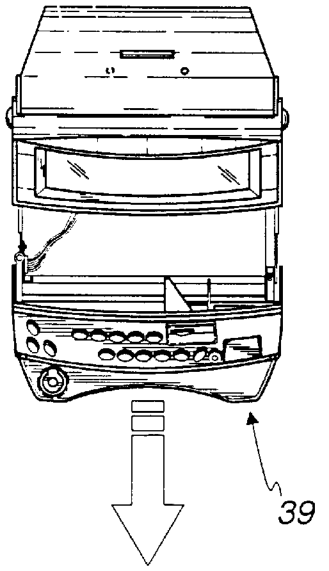
FIG. 10 is a top perspective view of the gaming machine housing illustrated in FIG. 1, shown with a door chassis, in accordance with one aspect of the present invention, in an extended position and the door in closed position.
Figure 11:
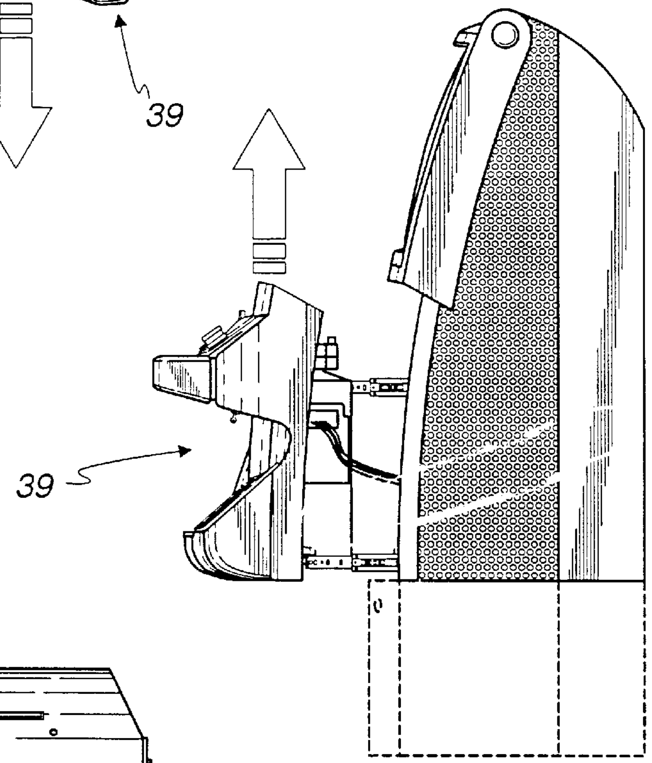
FIG. 11 is similar to to FIG. 10 except that it is a side-perspective view.
Figure 12:
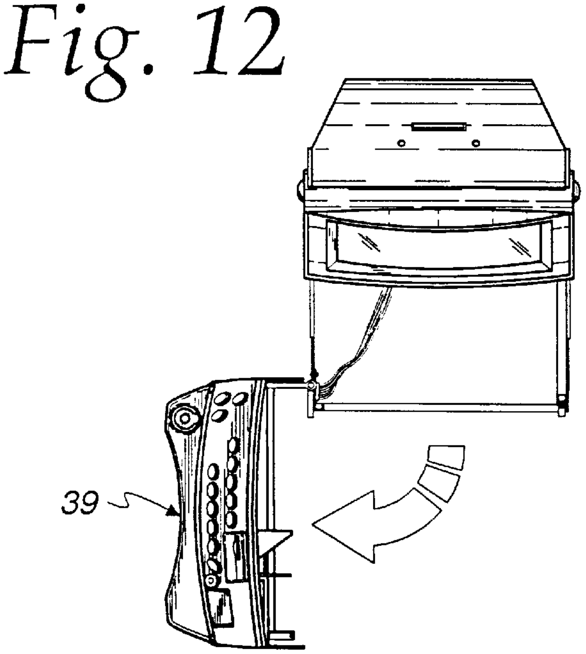
FIG. 12 is a top perspective view of the gaming machine housing illustrated in FIG. 1, shown with door chassis in an extended position and the door in an open position.

In accordance with an important aspect of the gaming machine housing, the lower front housing portion 39 may be mounted to the gaming machine in a manner to enable it to be pulled out to an extended position as generally shown in FIGS. 10 and 11 and to pivot as generally shown in FIG. 12 from the extended position . This configuration allows gaming machines to be placed closer together while at the same time providing full access to the interior of the gaming machine.

Figure 5:
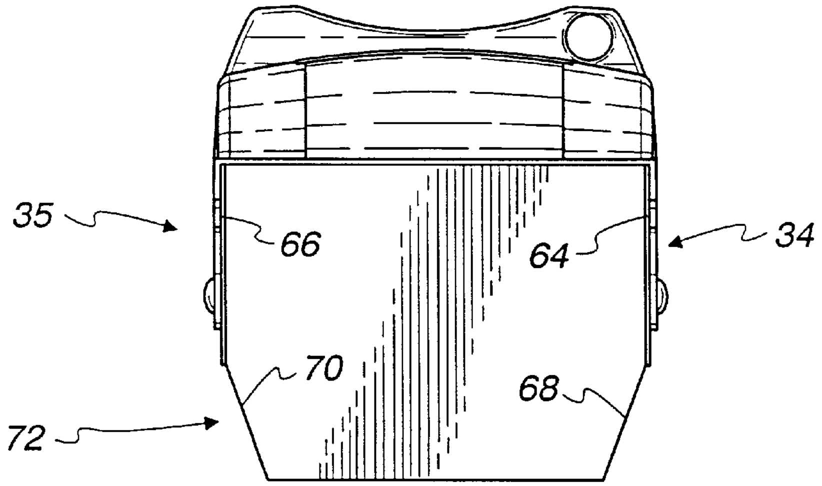
FIG. 5 is a bottom perspective view of the gaming machine housing illustrated in FIG. 1.
Figure 6:
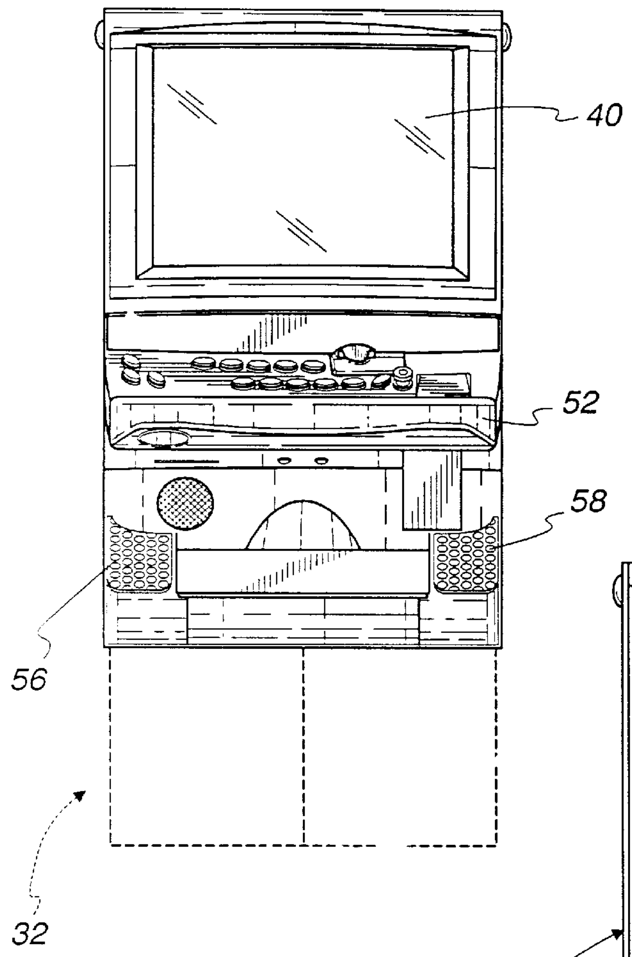
FIG. 6 is a front-elevational view of the gaming machine housing illustrated in FIG. 1.
Figure 7:
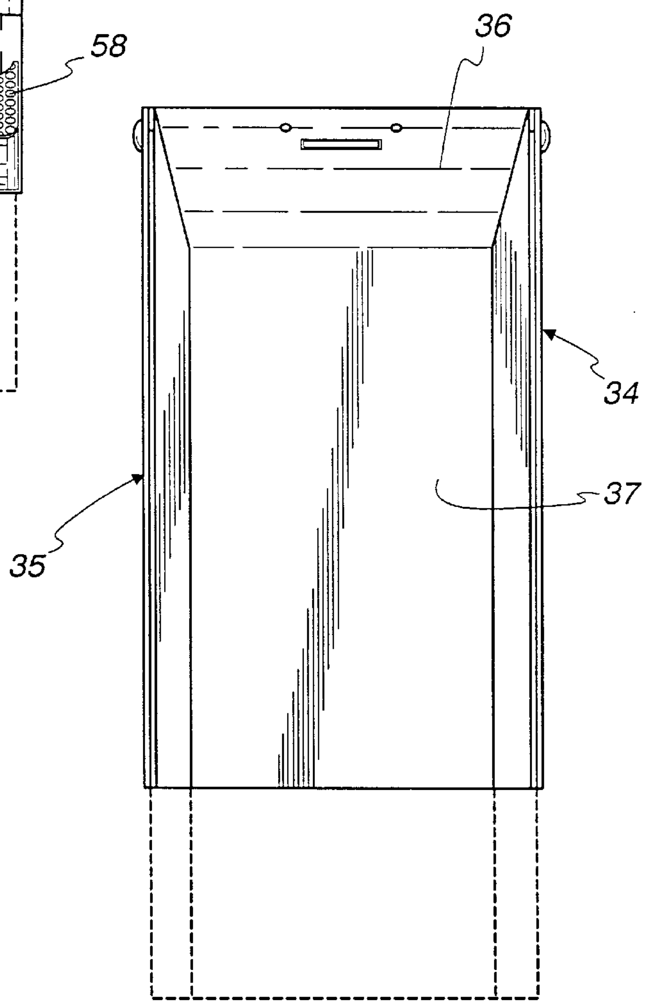
FIG. 7 is a rear-elevational view of the gaming machine housing illustrated in FIG. 1.
Figure 8:
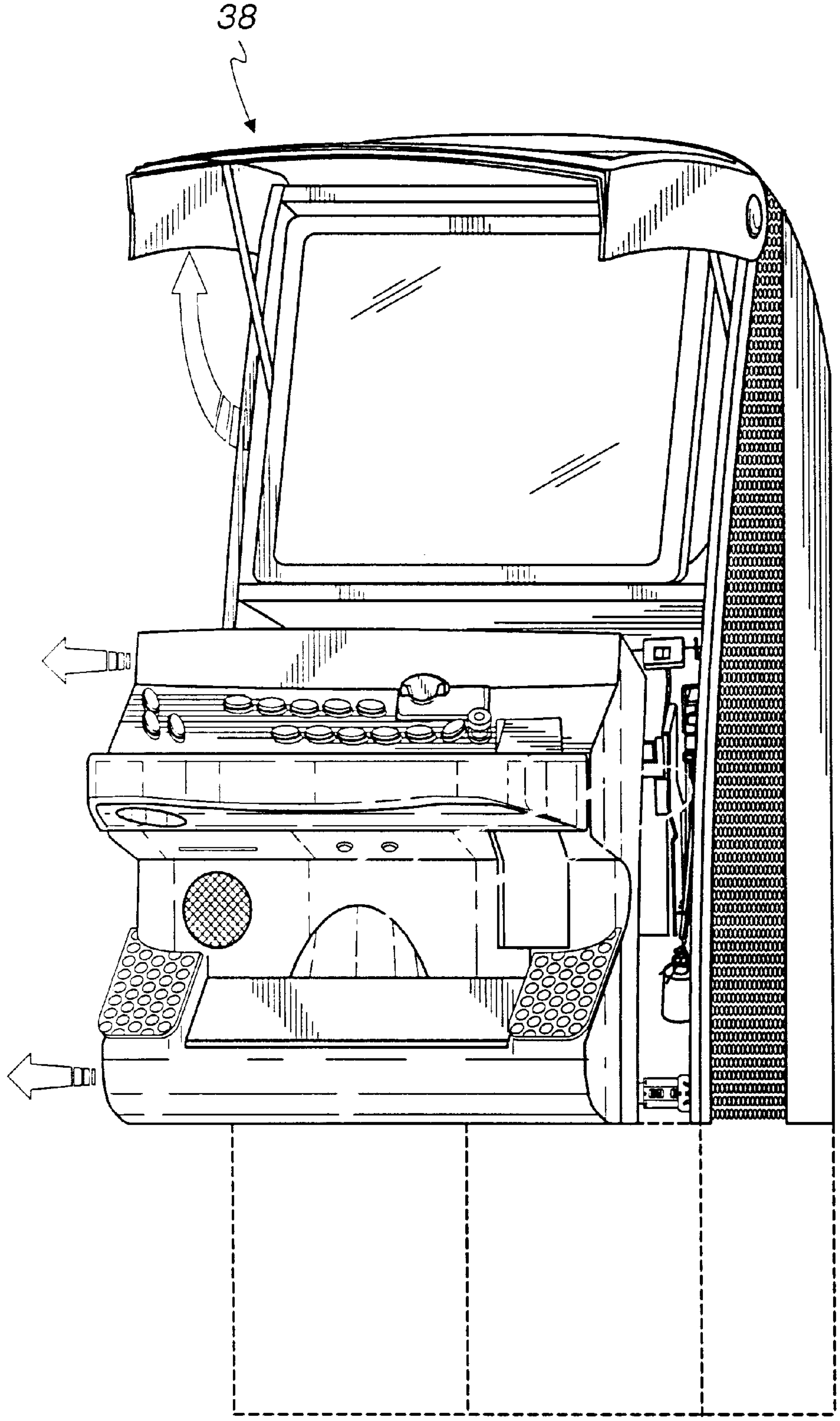
FIG. 8 is a front perspective view of the gaming machine housing illustrated in FIG. 1, shown with an upper front housing portion in an open position and the lower front housing portion partially pulled out.
Figure 9:
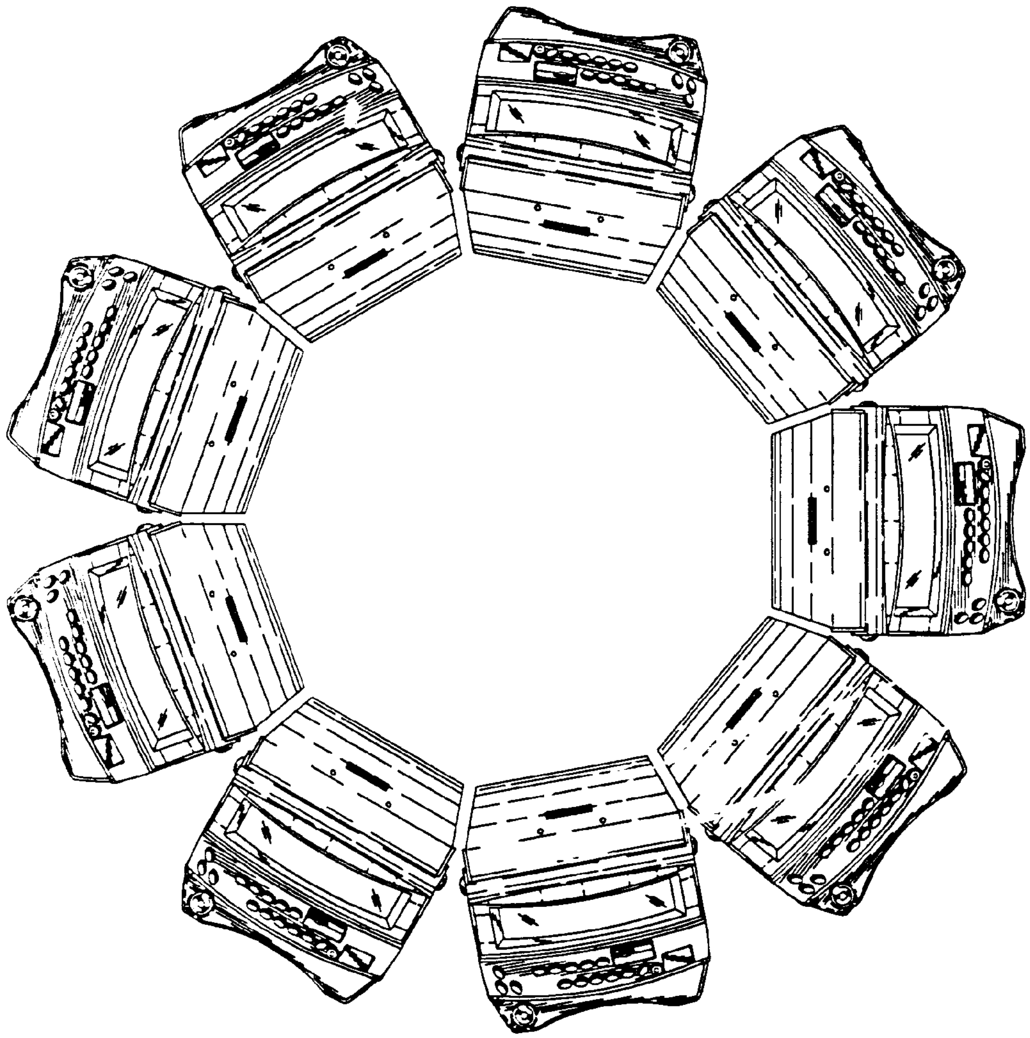
FIG. 9 is a top view of a circular cluster of gaming machine housing in accordance with the present invention illustrated in FIG. 1.

Referring to FIGS. 1–8, an exemplary gaming machine housing 30 is illustrated which includes a front housing portion 33 (FIGS. 2 and 3), left and right side housing portions, 34 and 35, respectively (FIGS. 1, 5 and 7), a top housing potion 36 (FIG. 7), a rear housing portion 37 (FIG.7) and a bottom housing portion 72 (FIG. 5). The front housing portion 33 (FIGS. 2 and 3) may be divided into an upper front housing portion 38 (FIGS. 1 and 8) and a lower front housing portion 39 (FIG.1). The upper front housing portion 38 may be pivotally mounted, for example, about a pivot axis 41 to enable the upper front housing portion 38 to be pivoted from a closed position, as shown in FIG. 1, to an open position, as shown in FIG. 8, to provide access to the video display 40 (FIG. 1) for maintenance and replacement. In order to prevent unauthorized access into the gaming machine 30, a latch or other locking arrangement (not shown) may be is used to secure the upper front housing 38 in a latched position as shown in FIG. 1.

The upper front housing portion 38 is used to frame a video display 40, for example, a cathode ray tube video display. As such, the upper front housing portion 38 is provided with a central rectangular aperture 43, sized in accordance with the dimensions of the video display 40, and formed with beveled surfaces 45 around the rectangular aperture 43 to frame the video display 40 and eliminate any gaps between the video display 40 and the upper front housing portion 38. The upper front housing portion 38 may also be formed with extending sidewalls 42, 44 (FIGS. 2 and 3) adapted to overlap the left and right side housing portions 34 and 35, respectively, in a closed position as shown in FIGS. 2 and 3.

The lower front housing portion 39 is formed with a first surface 46 (FIGS. 1–3). The angle of the first surface 46 is selected so that it is coplanar with the upper front housing portion 38, as best shown in FIGS. 2 and 3. The lower front housing portion 39 may also be provided with a second surface 48 that is not parallel to the plane of the first surface 46. The second surface 48 may be generally planar and configured at an angle B (FIG. 3) with respect to a horizontal datum 50. The angle B s selected to promote player comfort and minimize player fatigue, for example, an acute angle in the range from 10° to 70°, preferably 25° to 45°. As best shown in FIGS. 2 and 3, the lower front housing portion 39 may be provided with sidewalls 60 and 62. These sidewalls 60 and 62 overlap the left and right side housing portions 34 and 35 in a closed position, as shown in FIGS. 1–3.

An integral or separately formed convenience shelf 52 (FIGS. 1–3) may be provided which extends generally parallel relative to the horizontal datum 50 (FIG. 2). The convenience shelf 52 may be provided with a cup holder 54 and provide shelf space for the convenience of the players.

In accordance with an important aspect of the invention, the left and right side housing portions 34 and 35 are configured to reduce the overall footprint of the gaming machine. As best shown in FIGS. 2, 3 and 5, the left and right side housing portions 34 and 35 are formed to be generally symmetric and non-planar in configuration. In particular, referring to FIG. 5, the left and right side housing portions 34 and 35 are formed with generally parallel surfaces 64 and 66, respectively, and converging angled surfaces 68 and 70, respectively. As such, as shown in FIG. 5, the footprint of the machine is not rectangular but includes a trapezoidal portion, generally identified with the reference numeral 72, which enables the gaming machines to be arranged in various configurations including the circular configuration illustrated in FIG. 9 to enable more gaming machines to be located in a given area on a casino floor or other gaming facility.

Integrated Footrests

Figure 21:
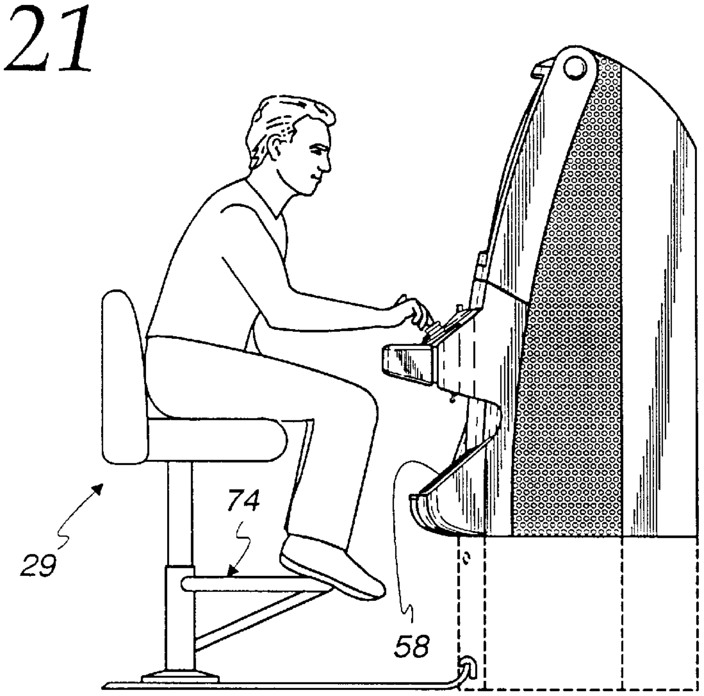
FIG. 21 is a side-elevational view of the gaming machine housing illustrated in FIG. 1, shown with a player and a bet button in a normal position.
Figure 22:
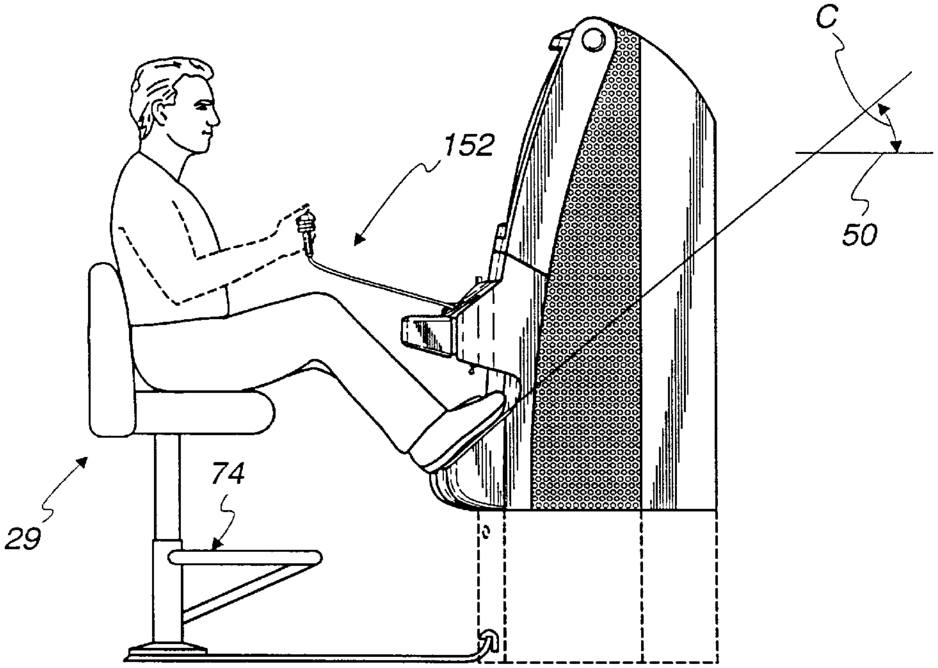
FIG. 22 is similar to FIG. 21 but with the bet button in an extended position and the player in a laid back position.

Normally, footrests are provided on gaming machine stools. In order to increase player comfort, a pair of footrests 56, 58 (FIGS. 1–3) are provided on the lower front housing portion 39 of the housing 30. These footrests 56, 58 may be integrally formed in the lower front housing portion 39 of the housing or formed separately and rigidly secured thereto. As shown best in FIGS. 1–3, the footrests 56, 58 are formed near the bottom of the lower front housing portion 39 on each end. As shown in FIGS. 1 and 2, the integrated footrests 56 and 58 are located at a height above the height of the footrests 74 (FIGS. 21, 22) provided on the game chair 29. The integral footrests 56 and 58 located on the lower front housing portion 39 provide increased player comfort by enabling a player to lean back and rest their feet as the game is played, as shown in FIG. 22.

The footrests 56, 58 are formed from angled surfaces, for example, at an angle C (FIG. 22) relative to a horizontal datum 50. The angle C is selected to optimize player comfort, for example between 20°–70°. As best shown in FIG. 1, the footrests 56, 58 may be provided with rubber pads 76 and 78, which may be secured to the footrests 56 and 58 with a suitable adhesive.

Dual Action Door Hinging

Access doors are normally provided on the front of gaming machines to provide access to the interior of the machine for in-situ maintenance and repair of the gaming machine on the casino floor. Such access doors limit how close gaming machines may be placed on a casino floor. More specifically, access doors normally are provided on the lower front portion of the gaming machine. Such access doors are normally hinged on one end. Unfortunately, the configuration of such gaming machines limits how close gaming machines can be placed while still enabling the access door to be fully opened. In particular, in many known gaming machines, the player controls are carried by an outwardly extending surface which extends outwardly relative to the plane of the access door. Such a configuration requires a certain amount of spacing between the machines in order for the access door to have sufficient clearance to be fully opened. In order to minimize the spacing between gaming machines, a dual-action access door in accordance with the present invention is provided which allows gaming machines to be placed relatively close together while at the same time providing the full access to the interior of the machine. In particular, FIGS. 10–20 illustrate a dual-action door assembly that enables the lower front housing portion 39 to be opened much like a file cabinet drawer from a closed position, as generally shown in FIG. 1, to an extended position as shown in FIGS. 10 and 11. Provisions are also provided to enable the lower front housing portion 39 to pivot in an extended position as shown in FIG. 12 to enable full access to the interior of the gaming machine for in-situ maintenance.

Figure 14:
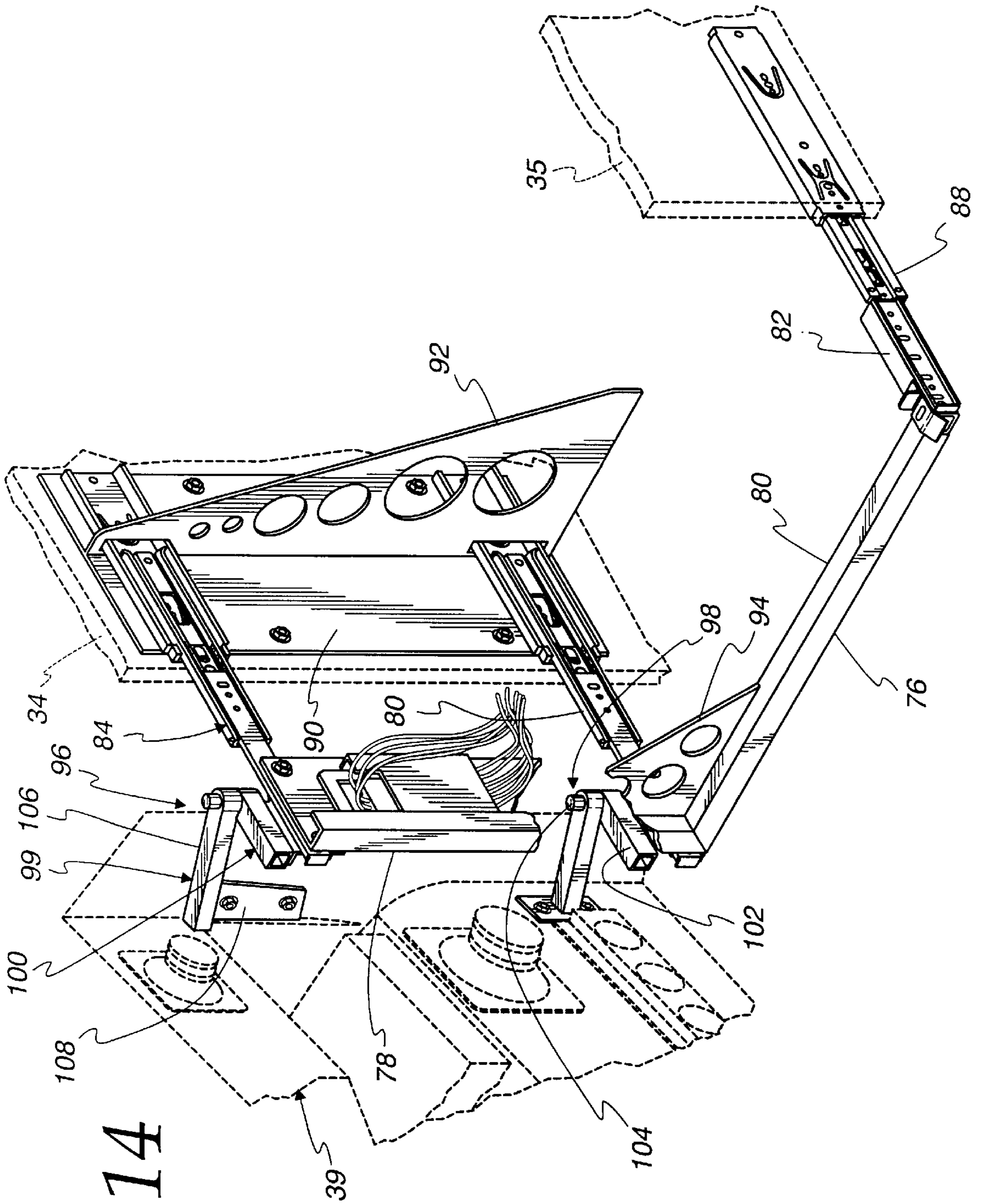
FIG. 14 is similar to FIG. 13 but with portions of the gaming machine and door chassis removed to more clearly illustrated the door chassis and door hinges.

Referring to FIG. 14, the lower front housing portion 39 is carried by a door chassis assembly, generally identified with the reference member 76. The door chassis assembly 76 includes a vertical frame member 78 and two horizontal frame members 80 and 82. The vertical frame member 78 and one of the horizontal frame members 80 are joined together at their respective ends to form an L-shaped configuration, generally parallel to the vertical datum 32 (FIG. 2). An opposing end of the horizontal frame 80 (FIG. 14) is connected to one end of the horizontal frame member 82 forming an L-shaped configuration, generally parallel to horizontal datum 50 (FIG. 3). Three telescoping drawer rails, 84, 86 and 88 are rigidly secured on one end to the frame members 78 and 82, for example, with suitable fasteners or by welding.

The horizontal frame members 80 and 82 may be formed with generally square or rectangular cross-sections. However, frame member 78 may be formed from J-channel for additional stiffening. The telescoping drawer rails 84 and 86 are rigidly attached to one end to the vertical frame member 78 with suitable fasteners. The drawer rail 88 is attached on one end to the horizontal frame member 82. The opposing ends of the drawer rails 84, 86 and 88 are attached to the interior of the left and right housing portions 34 and 35 with suitable fasteners. In order to provide additional stiffening, stiffening plates may be used. For example, a stiffening plate 90 may be attached directly to the interior of the left side housing portion 34 with suitable fasteners. The drawer rails 84 and 86 may then be attached to the stiffening plate 90.

Figure 13:
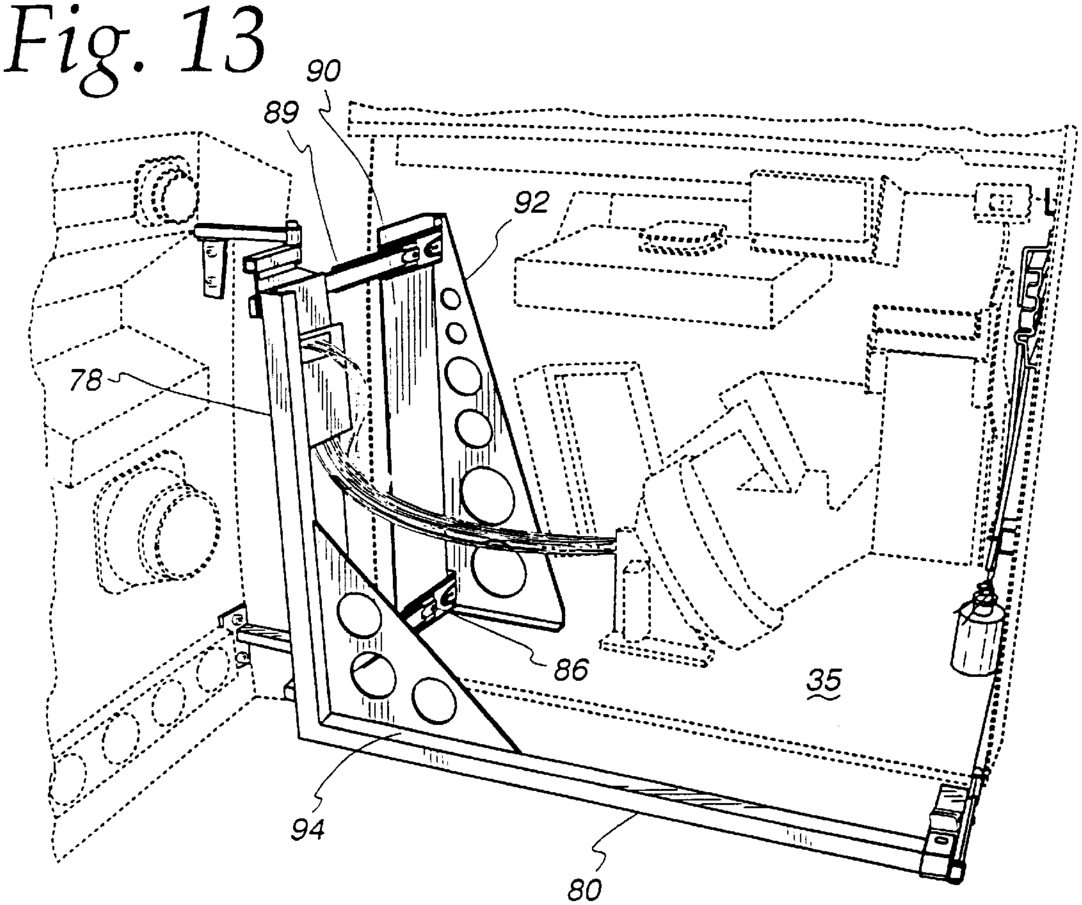
FIG. 13 is a partial perspective view of the gaming machine housing illustrated in FIG. 1, illustrate with the door chassis in an extended position and the door in an open position and shown with the interior of the gaming machine in phantom.

In order to provide additional stiffening, a gusset plate 92 may be rigidly attached to the stiffening plate 90 and rest on the bottom housing portion 72 (FIG. 5) as shown in FIGS. 13 and 14. An additional gusset plate 94 may be rigidly secured in the corner of the vertical frame member 78 and the horizontal frame member 80. The gusset plate 94 provides additional stiffening of the door chassis 76.

The door chassis assembly 76 enables the lower front housing portion 39 to slide out in a similar manner to a file drawer from a closed position as shown in FIG. 1 to an extended position as shown in FIGS. 10 and 11. In accordance with another aspect of the invention, the lower front housing portion 39 is pivotally mounted on one end about an axis generally parallel to a vertical datum 32 (FIG. 2). The pivotal mounting enables the lower front housing portion 39 to pivot from a closed position when the door chassis assembly 76 is in a partially or fully extended position as shown in FIGS. 10 and 11 to an open position as shown in FIG. 12, thus providing a dual-action door.

In order to pivotally mount the lower front housing portion 39 relative to the door chassis 76, upper and lower hinge assemblies 96 and 98 are provided. Each hinge assembly 96, 98 includes two brackets 9, 100. The brackets 98 are rigidly attached to the interior of the front housing portion 39 while the brackets 100 are attached to the vertical support 78. Each of the brackets 99 are formed from a horizontal member 102 and a pin 104 configured to be generally parallel to the vertical datum 32 (FIG. 2) when secured to the vertical supports 78 defining a vertical pivot axis. The brackets 100 are formed from a pair of members 106, 108 configured in a generally L-shape. The members 106 are provided with apertures (not shown) for receiving the pins 104 to enable the lower front housing portion 39 to pivot about a vertical axis on the left side of the lower front housing portion 39.

Figure 20:
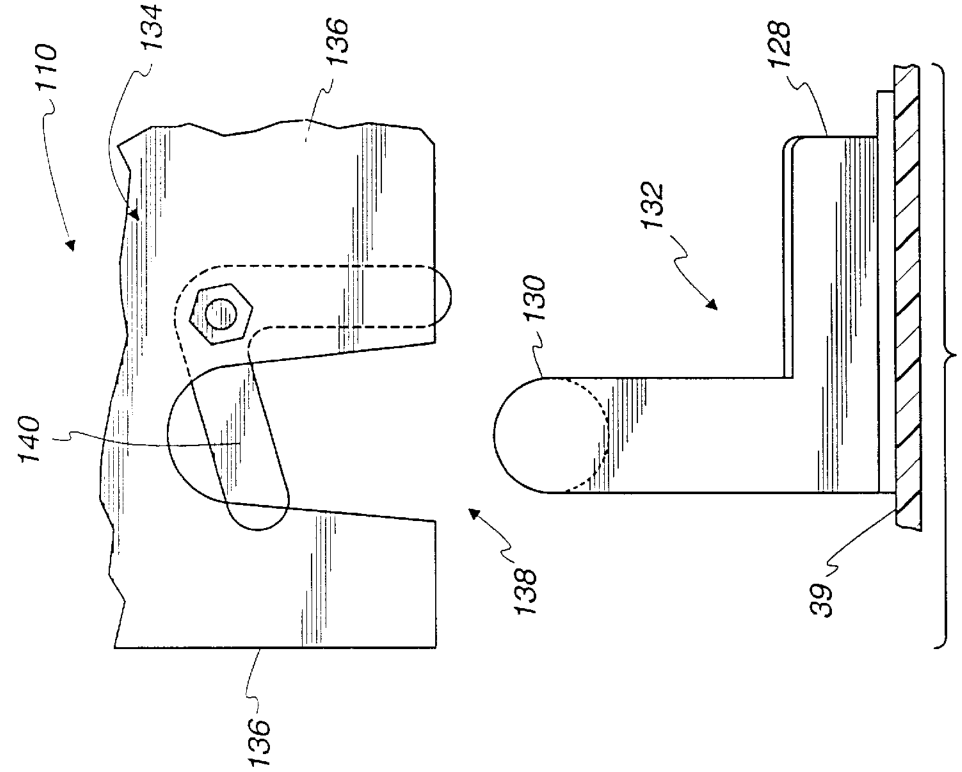
FIG. 20 is similar to FIG. 19 but in an unlatched position and the door partially opened.
Figure 19:
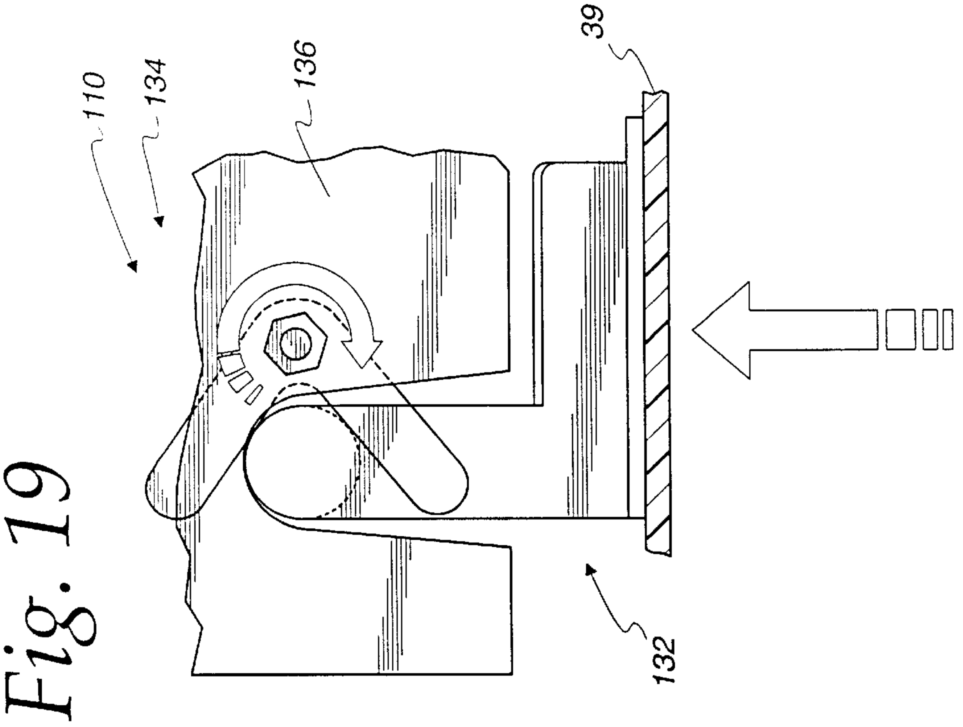
FIG. 19 is a partial elevational view with portions of the gaming machine removed illustrating the door latch assembly in a latched position.

The right side of the lower front housing portion 39 is secured by upper and lower latch assemblies 110 and 112 respectively. The upper latch assembly 110 is illustrated in FIGS. 19 and 20 while the lower latch assembly 112 is illustrated in FIGS. 15–17.

Figure 15:
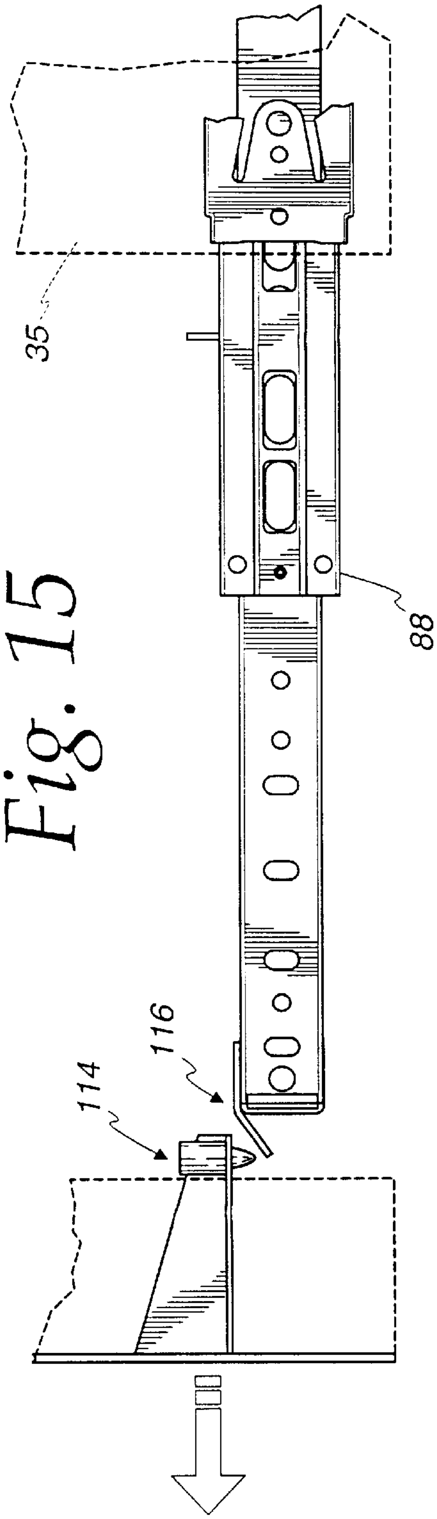
FIG. 15 is a partial elevational view illustrating the door rail which forms a part of the door chassis in an extended position.
Figure 17:
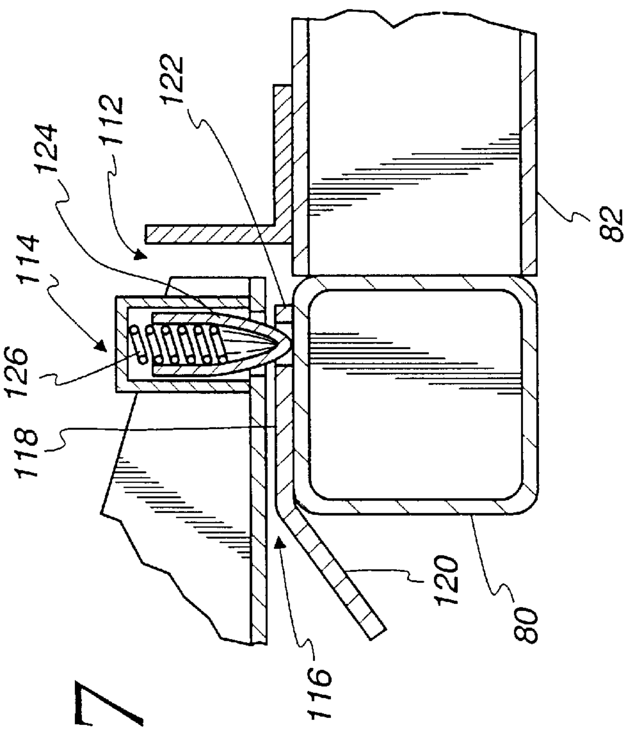
FIG. 17 is a partial sectional view of a position of the door chassis, shown with the door closed, illustrating the bottom door latch assembly.
Figure 16:
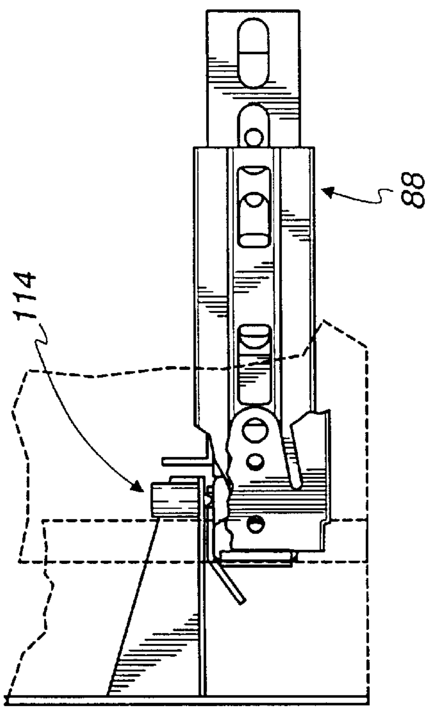
FIG. 16 is similar to FIG. 15 but in retracted or closed position.

Referring first to FIGS. 15–17, the lower latch assembly 112 includes a bullet pin assembly 114 and a latch plate 116. The latch plate 116 is formed with a flat surface 118, attached or secured directly to the horizontal frame member 80 and a ramped surface 120. The flat surface 118 is formed with an aperture 122 for latching the bullet pin assembly 114 as generally shown in FIG. 17. The bullet pin assembly 114 includes a bullet pin 124, spring loaded by way of a spring 126, as best shown in FIG. 17. In a latched position as shown in FIG. 17, the bullet pin 124 is biased downwardly into the aperture 122.

The tension of the spring 126 is selected such that a relatively small horizontal force on the lower front housing portion 39 causes the bullet pin 124 to move upwardly and compress the spring 126, thus unlatching the bullet pin assembly 114 from the latch plate 116, as generally shown in FIG. 15. The ramped surface 120 on the latch plate 116 causes the bullet pin 124 to move upwardly, thus compressing the spring 126, as the lower front housing portion 39 is moved toward a closed position as shown in FIGS. 10 and 11. The compression forces of the spring 126 bias the bullet pin 124 downwardly as the top of the bullet pin 124 slides across the flat surface 118 of the latch plate 116. Once the bullet pin 124 is over the aperture 122 in the latch plate 116, the bullet pin 124 is biased downwardly as shown in FIG.

17, latching the right lower portion of the lower front housing position 39 to the door chassis 76.

FIGS. 19–20 illustrate the upper latch assembly 110. The upper latch assembly 110 is used to latch the upper right side of the lower front housing portion 39 in a closed position for example as shown in FIG. 1. The upper latch assembly 110 must be latched in order to allow the door chassis assembly 76 to be pulled out to an extended position as shown in FIGS. 13 and 14. The upper latch assembly 110 is similar to a car door latch assembly and includes pair of parallel spaced apart L-shaped brackets 128 and a pin 130 extending there between forming a bracket assembly 132. The bracket assembly 132 is rigidly attached to the interior of the lower front housing portion 39 access door.

A latch subassembly 134 is formed on the interior of the right side housing portion 35. The latch subassembly 134 includes a plate 136, rigidly attached to the right housing portion 35 and a generally U-shaped slot 138. The pin 130 on the bracket assembly 132 is adapted to be received in the U-shaped slot 138 as generally shown in FIG. 19. A latching mechanism formed from a pivotally mounted L-shaped member 140 is used to capture the pin 130 in the slot 138 in a latched position as generally shown in FIG. 20. When the L-shaped member 140 is rotated counter-clockwise, as generally shown in FIG. 20, the pin 130 is released to allow the lower front housing portion 39 to be unlatched.

Figure 18:
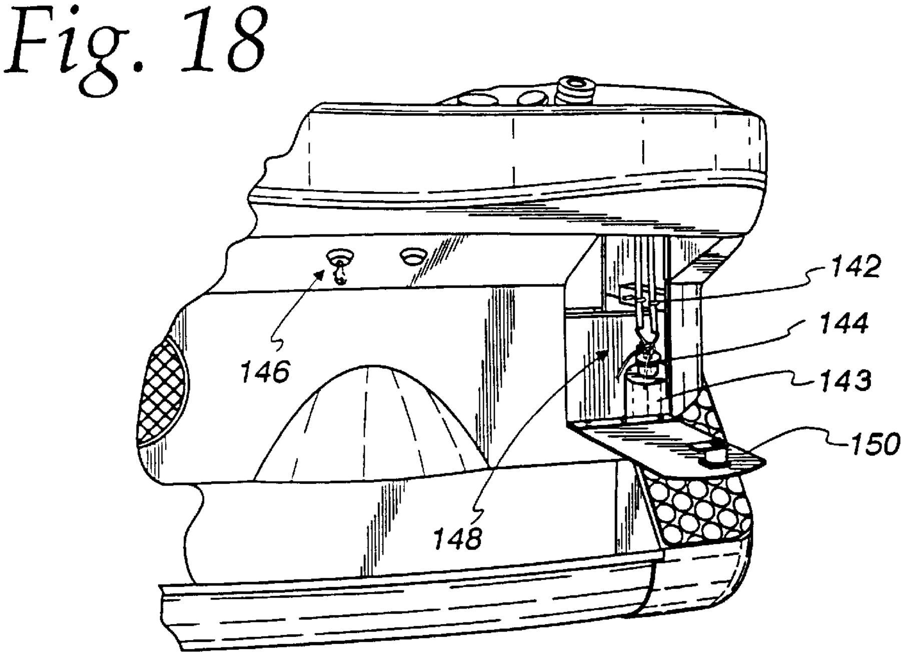
FIG. 18 is a partial perspective view of the gaming machine housing illustrated in FIG. 1, illustrating an access door in an open position and revealing a portion of the upper door latch assembly.

Normally the L-shaped member 140 is spring loaded in a clockwise direction to force the L-shaped member into the position as generally shown in FIG. 19. A release cable 142 (FIG. 18) is attached to one end of the L-shaped member 140. The release cable 142 is used to overcome the spring force in order to rotate the L-shaped member 140 in a counter-clockwise position as generally shown in FIG. 20 in order to release the pin 130. The other end of the release cable 142 may be attached to a solenoid 143 (FIG. 18). In a normal position, the solenoid 143 is not powered and thus does not tension the release cable 142. When electrical power is applied to the solenoid 143, a plunger 144 on the solenoid 143 is retracted to place tension on the release cable 142 in order to rotate the L-shaped member 140 (FIG. 20) to enable the lower front housing portion 39 to be unlatched.

The solenoid 143 (FIG. 8) may be key operated. For example, as shown in FIG. 18, a key-operated switch 146 may be located on the housing 30. Thus, when a key is inserted and turned to the on position, the solenoid 143 is powered up in order to enable the upper latch assembly 110 to be released. However, use of the solenoid 143 requires that the machine be connected to a source of electrical power.

In the event of a power failure or need to access the machine when no power is available, a portal 148 (FIG. 18) may be provided on the front portion of the lower front housing portion 39, adjacent the solenoid 143. As shown in FIG. 18 the portal 148 maybe is hinged at the bottom and may be secured at the top with a simple key latch 150. During conditions when electric power is not available, the portal 148 is simply opened and tension manually placed on the release cable 142 to unlatch the upper latch assembly 110.

Remote Bet Button

In order to improve the player comfort, an extendable bet button, generally identified with the reference numeral 152 (FIGS. 22–24), provides additional player comfort. For example, as illustrated in FIG. 21, a player is shown at a gaming machine in a first conventional position. In this position, the player is forced to sit at arm's length to the gaming machine controls. The extendable bet button 152 allows the player to lean back and play the game while in a more comfortable position as shown in FIG. 22.

Figure 23:
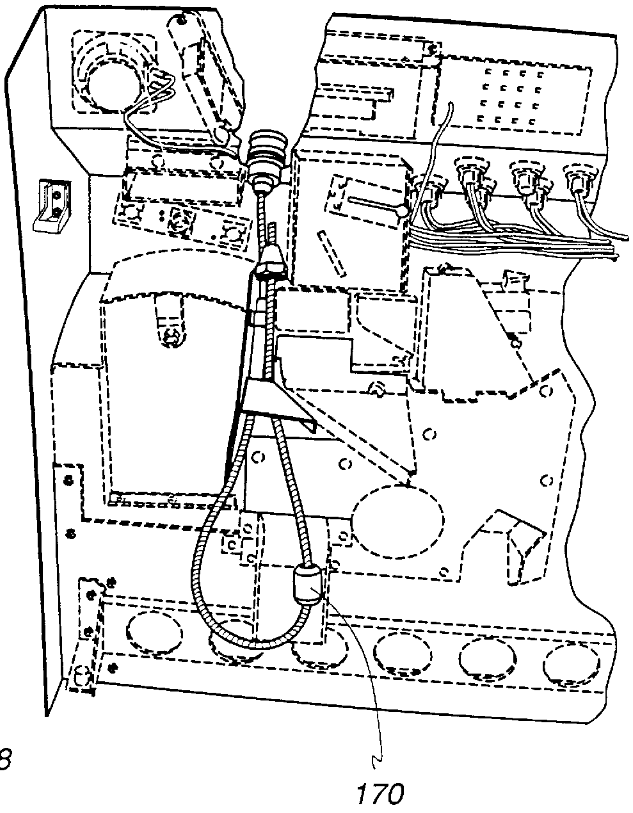
FIG. 23 is a partial view of the interior side of the door in phantom illustrating a bet button in a retracted position.

The extendable bet button 152 is disposed on the interior side of the lower front housing portion 39, as generally shown in FIGS. 22 and 23. FIG. 22 shows the extendable bet button 152 in a fully retracted position while FIG. 23 shows the extendable bet button in an extended position.

The extendable bet button 152 includes a conventional push button switch 154 (FIG. 24) and a rearwardly extending reduced diameter cylindrical member 156. The cylindrical member 156 is provided with a through hole for receiving an electrical cable 158 that is attached to the switch 154. The electrical cable 158 may be provided as an armored cable to minimize wear. A generally cylindrical grommet 160 is carried by the surface 48 (FIGS. 1–3) on the lower front housing portion 39. The cylindrical grommet 160 includes a central aperture 162 for receiving the cylindrical member 156, as generally shown in FIG. 23.

Figure 24:
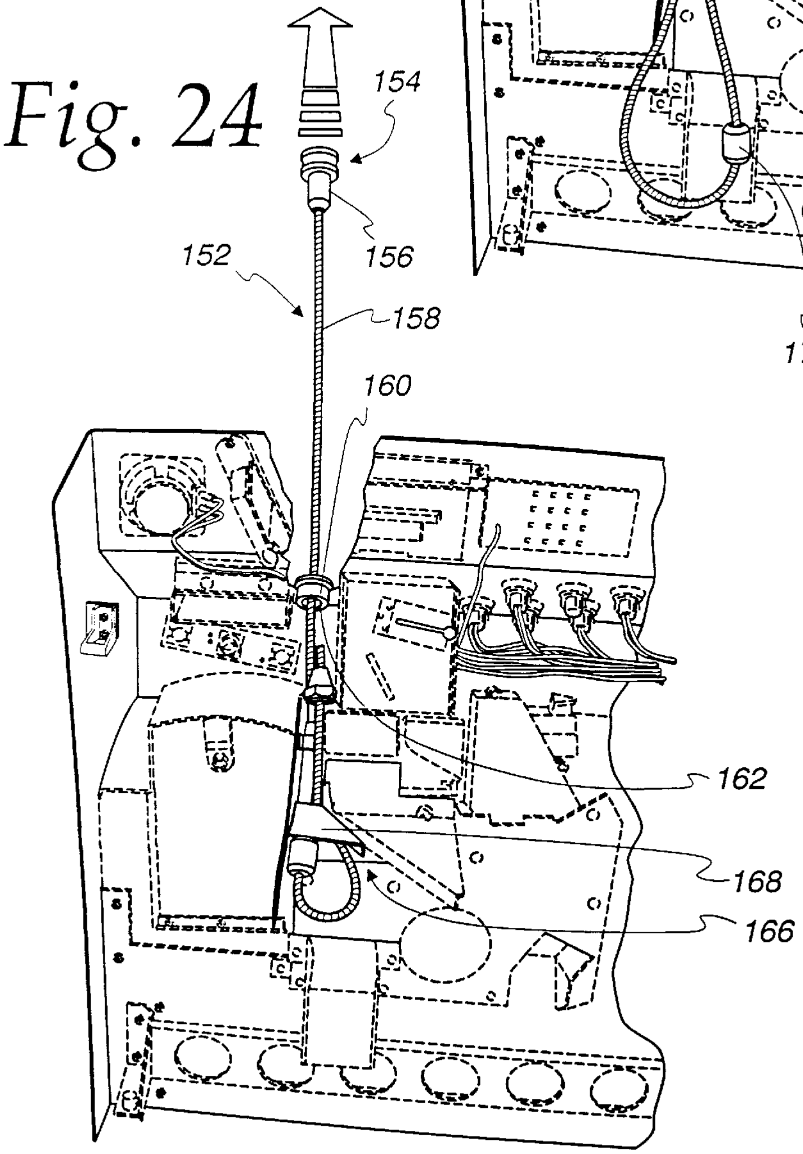
FIG. 24 is similar to FIG. 23 but showing the bet button in an extended position.

The cable 158 is attached on one end to the game controls (not shown) in a conventional manner. In order to prevent the extended bet button 154 from being disconnected from the gaming machine, a stop assembly 166 is provided. The stop assembly 166 includes a bracket 168 defining an access area which enables the cable 158 to freely slide through. A generally cylindrical weight 170 is attached around the armored cable 158 at a distance selected to prevent axial forces from being placed on the electrical connection to the gaming machine in an extended position. The cylindrical weight 170 has a relatively larger diameter than the cable 158. In a normal position, as shown in FIG. 23, the weight 170 rests in the interior of the lower front housing portion 39. When the bet button 154 is in an extended position as shown in FIG. 24, the diameter of the weight 170 is much larger than the access through the bracket 168 thus preventing further movement of the armored cable 158 stop as generally shown in FIG. 24.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A gaming machine housing comprising:

a top housing portion;

a pair of side housing portions;

a rear housing portion, said top, side and rear housing portions connected together defining a front opening;

a front housing portion for closing said front opening;

a door chassis for carrying at least a portion of said front housing portion, said door chassis comprising one or more hinges to enable said front housing portion to pivot about an axis generally parallel to a vertical datum in at least a partially extended position forming a dual action door;

one or more rails for carrying said front housing portion, configured to enable movement of said front housing portion between a closed position and an extended position;

a first latching assembly for latching said front housing portion to one of said side housing portions; and a second latching assembly for latching said front housing assembly to said door chassis.

2. A gaming machine housing comprising:

a top housing portion;

a pair of side housing portions;

a rear housing portion, said top, side and rear housing portions connected together defining a front opening;

a front housing portion for closing said front opening;

a door chassis for carrying at least a portion of said front housing portion, said door chassis comprising one or more hinges to enable said front housing portion to pivot about an axis generally parallel to a vertical datum in at least a partially extended position forming a dual action door;

one or more rails for carrying said front housing portion, configured to enable movement of said front housing portion between a closed position and an extended position;

a first latching assembly for latching said front housing portion to one of said side housing portions, said first latching assembly being manually and electrically operable; and an access door in said front housing to provide access to said first latching assembly for manual operation.

3. An assembly for attaching a front housing portion to a gaming machine, the assembly comprising:

a chassis formed of a plurality of supports, said supports adapted to be coupled to said front housing portion;

one or more telescoping rails, connected between said chassis and an interior of a gaming machine, said rails configured to enable movement of said front housing portion from a closed position to a fully extended position; and one or more hinge assemblies for pivotally mounting said front housing portion on one end to said chassis to enable said front housing portion to pivot about an axis generally parallel to a vertical datum.

4. An assembly for attaching a front housing portion to a gaming machine, the assembly comprising:

a chassis formed of a plurality of supports, said supports adapted to be coupled to said front housing portion and to gaming controls; and one or more telescoping rails, connected between said chassis and an interior of a gaming machine, said rails configured to enable movement of said front housing portion from a closed position to a fully extended position.

5. A gaming machine comprising:

a housing comprising:

first and second side housing portions;

a rear housing portion;

a top housing portion;

a bottom housing portion; and a front housing portion;

a first telescoping rail coupled to said first side housing portion at a first height;

a second telescoping rail coupled to said first side housing portion at a second height that is lower than said first height;

a third telescoping rail coupled to said second side housing portion;

a first frame member coupled to said first and second telescoping rails;

a second frame member coupled to said first frame member and to said third telescoping rail;

a hinge coupled to said first frame member;

said front housing portion coupled to said hinge and able to slide on said first, second and third telescoping rails between extended and non-extended positions and able to pivot on said hinge between an open position and a closed position;

a video display associated with said housing and adapted to display video gambling game images;

a value accepting device associated with said housing and adapted to receive value to be wagered on an outcome of a video gambling game; and a control panel associated with said housing and comprising a plurality of selection devices associated with said video gambling game.

6. The gaming machine of claim 5, further comprising a stiffening plate disposed between said first and second telescoping rails and said first side housing portion.

7. The gaming machine of claim 5, further comprising a gusset plate coupled to said first and second frame members.

8. The gaming machine of claim 5, wherein said hinge is a first hinge, said gaming machine further comprising a second hinge coupled to said first frame member and said front housing portion.

9. A gaming machine comprising:

a housing comprising first and second side housing portions;

a first telescoping rail coupled to said first side housing portion at a first height;

a second telescoping rail coupled to said first side housing portion at a second height that is lower than said first height;

a third telescoping rail coupled to said second side housing portion;

a first frame member coupled to said first and second telescoping rails;

a second frame member coupled to said first frame member and to said third telescoping rail;

a hinge coupled to said first frame member;

a front housing portion coupled to said hinge and able to slide on said first, second and third telescoping rails between extended and non-extended positions and able to pivot on said hinge between an open position and a closed position;

a video display associated with said housing and adapted to display video gambling game images;

a value accepting device disposed associated with said housing and adapted to receive value to be wagered on an outcome of a video gambling game; and a control panel associated with said housing and comprising a plurality of selection devices associated with said video gambling game.

10. The gaming machine of claim 9, further comprising a stiffening plate disposed between said first and second telescoping rails and said first side housing portion.

11. The gaming machine of claim 9, further comprising a gusset plate coupled to said first and second frame members.

12. The gaming machine of claim 9, wherein said hinge is a first hinge, said gaming machine further comprising a second hinge coupled to said first frame member and said front housing portion.

13. A gaming machine comprising:

a housing comprising first and second side housing portions;

a plurality of telescoping members coupled to said housing;

a frame member coupled to at least some of said plurality of telescoping members;

a hinge coupled to said frame member;

a front housing portion coupled to said hinge and able to slide on said plurality of telescoping members between extended and non-extended positions and able to pivot on said hinge between an open position and a closed position;

a video display associated with said housing and adapted to display video gambling game images;

a value accepting device disposed associated with said housing and adapted to receive value to be wagered on an outcome of a video gambling game; and a control panel associated with said video gambling game.

14. The gaming machine of claimed 13, wherein at least one of said plurality of telescoping members is coupled to said first side housing portion.

15. The gaming machine of claim 14, wherein at least one of said plurality of telescoping members is coupled to said second side housing portion.

16. The gaming machine of claim 13, wherein said frame member is a substantially vertical frame member.

17. The gaming machine of claim 13, further comprising a stiffening plate disposed between at least some of said plurality of telescoping members and said housing.

18. The gaming machine of claim 13, wherein said hinge is a first hinge, said gaming machine further comprising a second hinge coupled between said frame member and said front housing portion.

19. A gaming machine comprising:

a housing comprising:

first and second side housing portions;

a top housing portion;

a bottom housing portion; and a front housing portion;

a first telescoping rail coupled to said first side housing portion at a first height;

a second telescoping rail coupled to said first side housing portion at a second height that is lower than said first height;

a third telescoping rail mounted to said second side housing portion;

said front housing portion coupled to said first, second and third telescoping rails and adapted to slide between a closed position and an open position;

a video display associated with said housing and adapted to display video gambling game images;

a value accepting device associated with said housing and adapted to receive value to be wagered on an outcome of a video gambling game; and a control panel associated with said housing and including a plurality of selection devices associated with said video gambling game.

20. The gaming machine of claim 19, further comprising:

a frame member coupled to said first and second telescoping rails; and a hinge coupled to said frame member and said front housing portion to enable said front housing member to pivot on said hinge between an open position and a closed position.

21. The gaming machine of claim 20, wherein said hinge is a first hinge, said gaming machine further comprising a second hinge coupled to said frame member and said front housing portion.

22. The gaming machine of claim 19, further comprising a stiffening plate disposed between said first and second telescoping rails and said first side housing portion.

23. A gaming machine comprising:

a housing comprising:

first and second side housing portions;

a top housing portion;

a bottom housing portion; and a front housing portion;

a plurality of telescoping members associated with said housing;

said front housing portion coupled to said plurality of telescoping members and adapted to slide between a closed position and an open position;

a frame member coupled to at least some of said plurality of telescoping members;

a hinge coupled to said frame member and said front housing portion to enable said front housing member to pivot on said hinge between an open position and a closed position;

a video display associated with said housing and adapted to display video gambling game images;

a value accepting device associated with said housing and adapted to receive value to be wagered on an outcome of a video gambling game; and a control panel associated with said housing and adapted to allow a user to control play of said video gambling game.

24. The gaming machine of claim 23, wherein said hinge is a first hinge, said gaming machine further comprising a second hinge coupled to said frame member and said front housing portion.

25. A gaming machine comprising:

a housing comprising:

first and second side housing portions;

a top housing portion;

a bottom housing portion; and a front housing portion;

a plurality of telescoping members associated with said housing;

a stiffening plate disposed between at least some of said plurality of telescoping members and said housing;

said front housing portion coupled to said plurality of telescoping members and adapted to slide between a closed position and an open position;

a video display associated with said housing and adapted to display video gambling game images;

a value accepting device associated with said housing and adapted to receive value to be wagered on an outcome of a video gambling game; and a control panel associated with said housing and adapted to allow a user to control play of said video gambling game.

* * * * *